(12) United States Patent
Mattisson

(10) Patent No.: US 7,675,375 B2
(45) Date of Patent: *Mar. 9, 2010

(54) ELECTRICAL OSCILLATOR CIRCUIT AND AN INTEGRATED CIRCUIT

(75) Inventor: Sven Mattisson, Bjärred (SE)

(73) Assignee: Telefonaktiebolaget L M Ericsson (PUBL), Stockholm (SE)

( * ) Notice: Subject to any disclaimer, the term of this patent is extended or adjusted under 35 U.S.C. 154(b) by 0 days.

This patent is subject to a terminal disclaimer.

(21) Appl. No.: 12/185,320

(22) Filed: Aug. 4, 2008

(65) Prior Publication Data

US 2008/0284533 A1 Nov. 20, 2008

Related U.S. Application Data

(63) Continuation of application No. 10/478,973, filed on May 27, 2004, now Pat. No. 7,432,772.

(60) Provisional application No. 60/298,408, filed on Jun. 18, 2001.

(51) Int. Cl.
*H03B 5/32* (2006.01)

(52) U.S. Cl. ............. 331/158; 331/116 R; 331/116 FE; 331/185

(58) Field of Classification Search ................. 331/185, 331/158, 116 R, 116 FE
See application file for complete search history.

(56) References Cited

U.S. PATENT DOCUMENTS 6,278,336 B1 * 8/2001 Tinsley et al. ................. 331/74

FOREIGN PATENT DOCUMENTS

EP 0 486 207 A1 * 5/1992

* cited by examiner

*Primary Examiner*—Arnold Kinkead
(74) *Attorney, Agent, or Firm*—Michael G. Cameron

(57) ABSTRACT

An electrical oscillator circuit comprising: a resonator comprised in the first subcircuit; and an active device comprised in the second subcircuit connected to energize the resonator to provide an oscillating electrical signal transmitted as a differential signal via electrical conductors to the second subcircuit. The oscillator is characterized in that the second subcircuit comprises means for receiving the differential signal transmitted via the electrical conductors and converting the differential signal to a single-ended signal with reference to the signal ground reference of the second subcircuit. Thereby a noise robust oscillator signal is provided with the use of very few components. Particularly suitable for oscillators embodied in an integrated circuit with the resonator mounted on a printed circuit board, PCB. And an integrated circuit.

12 Claims, 3 Drawing Sheets

ELECTRICAL OSCILLATOR CIRCUIT AND AN INTEGRATED CIRCUIT

CROSS-REFERENCE TO RELATED APPLICATIONS

This patent application is a continuation of U.S. patent application Ser. No. 10/478,973 filed on May 27, 2004 now U.S. Pat. No. 7,432,772. This application incorporates by reference the entire disclosure of U.S. patent application Ser. No. 10/478,973.

This patent application claims the benefit of priority from U.S. Provisional Patent Application Ser. No. 60/298,408 filed on Jun. 18, 2001. This application incorporates by reference the entire disclosure of U.S. Provisional Patent Application Ser. No. 60/298,408.

TECHNICAL FIELD OF THE INVENTION

This invention relates to an electrical oscillator circuit comprising: a first subcircuit and a second subcircuit with a signal ground reference; a resonator unit comprised in the first subcircuit; an active device comprised in the second subcircuit connected to energize the resonator to provide an oscillating electrical signal transmitted as a differential signal via electrical conductors to the second subcircuit.

Moreover, the invention relates to an integrated circuit.

BACKGROUND OF THE INVENTION

Electrical oscillators are used in various types of electronic equipment for instance in equipment where microprocessors and/or communications means are involved.

Especially in communications means the oscillator is a very central device for obtaining timing and modulation/demodulation. In order to obtain modem high speed communication, a stable and precise oscillator is required. Further, since small size and long duration battery operation is typically in demand the oscillator consequently has to be small sized and consume a minimum of electrical power.

An oscillator for the above devices fulfilling the demands is typically implemented by means of a crystal mounted on printed circuit board, connected to an active device, e.g. a CMOS transistor in an integrated circuit providing an oscillator signal to components or subcircuits in the integrated circuit by energizing the crystal to make the crystal generate the oscillator signal. This may provide for an accurate oscillator signal.

Ideally the whole oscillator should be placed in the chip, but this would require too much substrate area on in the integrated circuit. Preferably, the active device is within the integrated circuit where it can be implemented easily along with other active devices in subcircuits using the oscillator signal. Moreover, the least possible number of active devices should be used i.a. in order to minimize power consumption as indicated above.

However, those facts, in combination with design rules and physical limitations impose very strict limitations on a circuit designer in creating the geometrical layout of the electrical connections between the resonator and the active device. Thus it cannot be ensured that the electrical connections are designed to follow a path not subjected to noise induction on the connections. As a matter of fact noise induction is a problem due to often heavy use of digital/logic gates and subcircuits in the integrated circuits, especially for those arranged for communications purposes.

A first known oscillator is implemented by means of a crystal mounted on a printed circuit board, connected to an active device e.g. a CMOS transistor in an integrated circuit providing an oscillator signal to components or subcircuits in the integrated circuit by energizing the crystal to make the crystal generate the oscillator signal. The oscillator signal is provided as the output of an inverter with its input connected to a terminal of the crystal by means of an electrical connection.

However, such an oscillator will be very sensitive to noise induced on the electrical connection. This in turn will ruin extraction of exact timing and oscillation information from the oscillator signal.

SUMMARY OF THE INVENTION

Consequently, the prior art involves the problem that oscillators arranged to consume low power are sensitive to noise induced on the electrical conductors extending between the resonator and the active device.

This problem is overcome when the device mentioned in the opening paragraph is characterized in that the second subcircuit comprises means for receiving the differential signal transmitted via the electrical conductors and converting the differential signal to a single-ended signal with reference to the signal ground reference of the second subcircuit.

Consequently, the oscillating electrical signal is provided as a single-ended signal with diminished noise sensitivity. The oscillation information, provided by the resonator, in the single-ended signal can thus be extracted and used by components in the second subcircuit for obtaining very exact timing information with the use of a minimum of components.

In a preferred embodiment of the electrical oscillator circuit the first subcircuit is arranged on a printed circuit board, PCB.

In a further preferred embodiment of the electrical oscillator circuit, the second subcircuit is arranged in an integrated circuit component, IC.

In still a further preferred embodiment the resonator is arranged to provide an oscillating signal across two terminals, each connected to one of two electrical connectors for transmitting the oscillating signal to the second subcircuit. Typically, it will be possible to layout the two electrical connectors close to each other in order to obtain a common mode noise induction, which in turn is suppressed in the means for receiving the differential signal.

When the resonator unit is a crystal, very precise and stable oscillating information is obtainable.

When the first subcircuit comprises a ground reference electrically connected to the ground reference of the second subcircuit, a common ground reference is obtained.

In a preferred embodiment the first subcircuit comprises a capacitor connected between a resonator terminal and the ground reference of the first subcircuit; said capacitor having a relatively low impedance at frequencies above the oscillating frequency and a relatively high impedance at the oscillating frequency. Thereby high frequency noise signals will be diminished by short circuiting them to the ground reference.

In a preferred embodiment the active device is a CMOS type transistor.

When the CMOS type transistor is coupled with its source terminal to the ground reference of the second subcircuit, with its drain terminal to a current or voltage supply and to one of the electrical conductors and with its gate connected to the other of the electrical conductors, a single-element active device is provided. This can further reduce the power consumption.

In a preferred embodiment the means is a differential amplifier.

When the means is connected to supply the single-ended signal to components comprised in the second subcircuit, a simple system for distributing a low noise oscillator signal to the components comprised in the second subcircuit is provided.

The oscillator can be powered by a capacitor. It is possible to supply the oscillator with power from a capacitor with small capacity during exchange of e. g. a battery pack. This is possible due to the small power consumption.

BRIEF DESCRIPTION OF DRAWINGS

The invention will be explained more fully below in connection with a preferred embodiment and with reference to the drawing, in which.

DETAILED DESCRIPTION OF PREFERRED EMBODIMENTS

Figure 1:
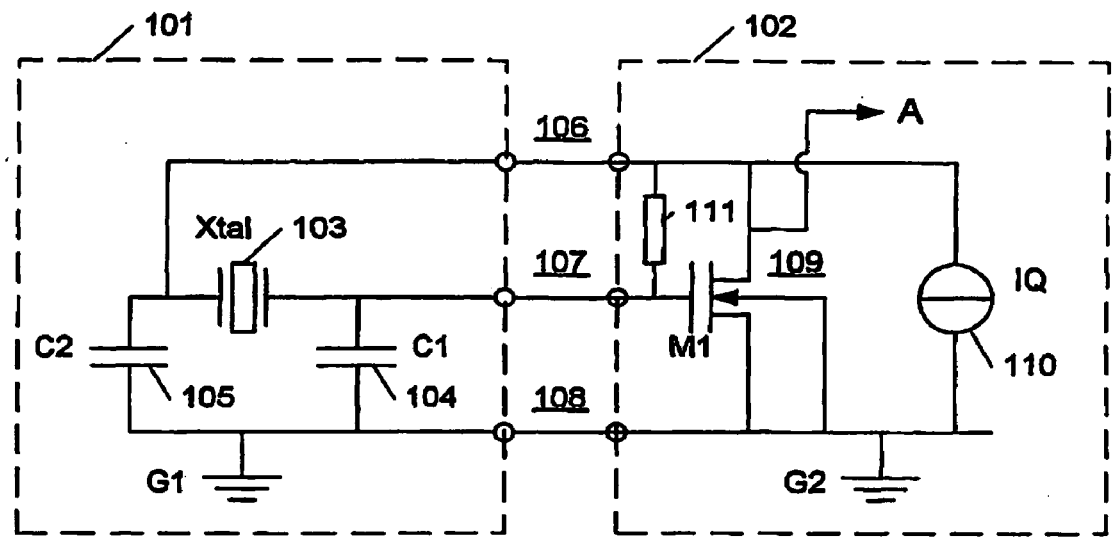
FIG. 1 shows an electrical oscillator circuit.

FIG. 1 shows an electrical oscillator circuit. The oscillator circuit is illustrated to comprise a first and a second subcircuit. The first subcircuit 101 is typically implemented by means of passive components mounted on a printed circuit board (PCB), whereas the second subcircuit 102 is implemented on a substrate in an integrated circuit (IC) component that is mounted on the PCB.

The first subcircuit 101 comprises an oscillating device in the form of a crystal (Xtal) 103 for instance with a nominal oscillating frequency of 32 Kilo Hertz. The crystal is electrically connected to the second subcircuit 102 by means of two connectors 106 and 107.

At frequencies about the nominal series resonance frequency the crystal has a relatively low impedance. However, at frequencies below and above the series resonance frequency the crystal has a relatively high impedance. Thus, below and especially above the nominal frequency an oscillating signal across the crystal will be sensitive to electromagnetic interference, that is, noise induced on the connectors 106 and 107. Capacitors 104 and 105 are connected to the crystal to provide a defined load and resonance frequency— and to couple high frequency signal components to a ground reference G1.

The second subcircuit 102 comprises an active device 109 in the form of a CMOS transistor biased by a current source (IQ) 110. The CMOS transistor and the current source are connected to a ground reference G2. The ground reference G2 is electrically connected to the ground reference G1 by means of a conductor 108.

Thus it is possible to detect an oscillating signal with reference to the ground reference G2 at point A in the second circuit.

A bias resistor 111 is applied between the drain and gate terminal of transistor 109 to provide proper working conditions for the transistor.

An oscillator of the above described type typically provides timing signals extracted from the oscillator signal by means of a two-transistor CMOS inverter to be provided to other subcircuits on the substrate in the above mentioned integrated circuit.

Figure 2:
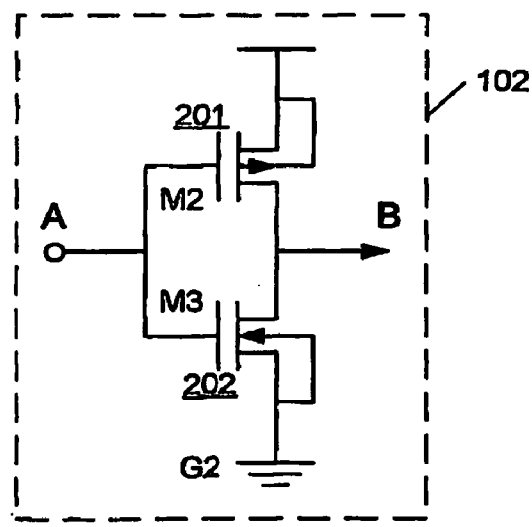
FIG. 2 shows an inverter.

FIG. 2 shows an inverter. The converter comprises two CMOS transistors M2 201 and M3 202 with their gate terminals connected to form an input terminal A. The drain terminal of transistor M2 202 is connected to a voltage supply V and the drain terminal of transistor M3 is connected to the ground reference. An output terminal B of the inverter is formed as a connection of the source terminals of the transistors M2 and M3. Thereby the inverter works as hard limiting inverter.

The inverter is connected to form a part of the subcircuit 102 by connecting point A of subcircuit 102 to point A of the inverter. The ground reference of the inverter is connected to the ground reference of the subcircuit 102. Thereby a square-wave oscillating signal is provided on the output B of the inverter.

The above described way of implementing an oscillator circuit is almost mandatory due to the following facts:

1. a crystal is preferred as resonator since it can generate a very precise oscillating signal;

2. the crystal is a relatively large component that would occupy too much substrate area in the integrated circuit and is not compatible with standard integrated circuit processing technology;

3. the crystal needs to be energized by an active device in order to generate an oscillating signal;

4. the active device is preferably within the integrated circuit where it can be implemented easily along with subcircuits using the oscillator signal; and 5. the least possible number of active devices should be used i.a. in order to minimize power consumption.

However, those facts, design rules and physical limitations impose very strict limitations on a circuit designer in creating the geometrical layout of the electrical connections between the resonator and the active device. Thus it cannot be ensured that the electrical connections are designed to follow a path not subjected to noise induction on the connections.

Figure 3:
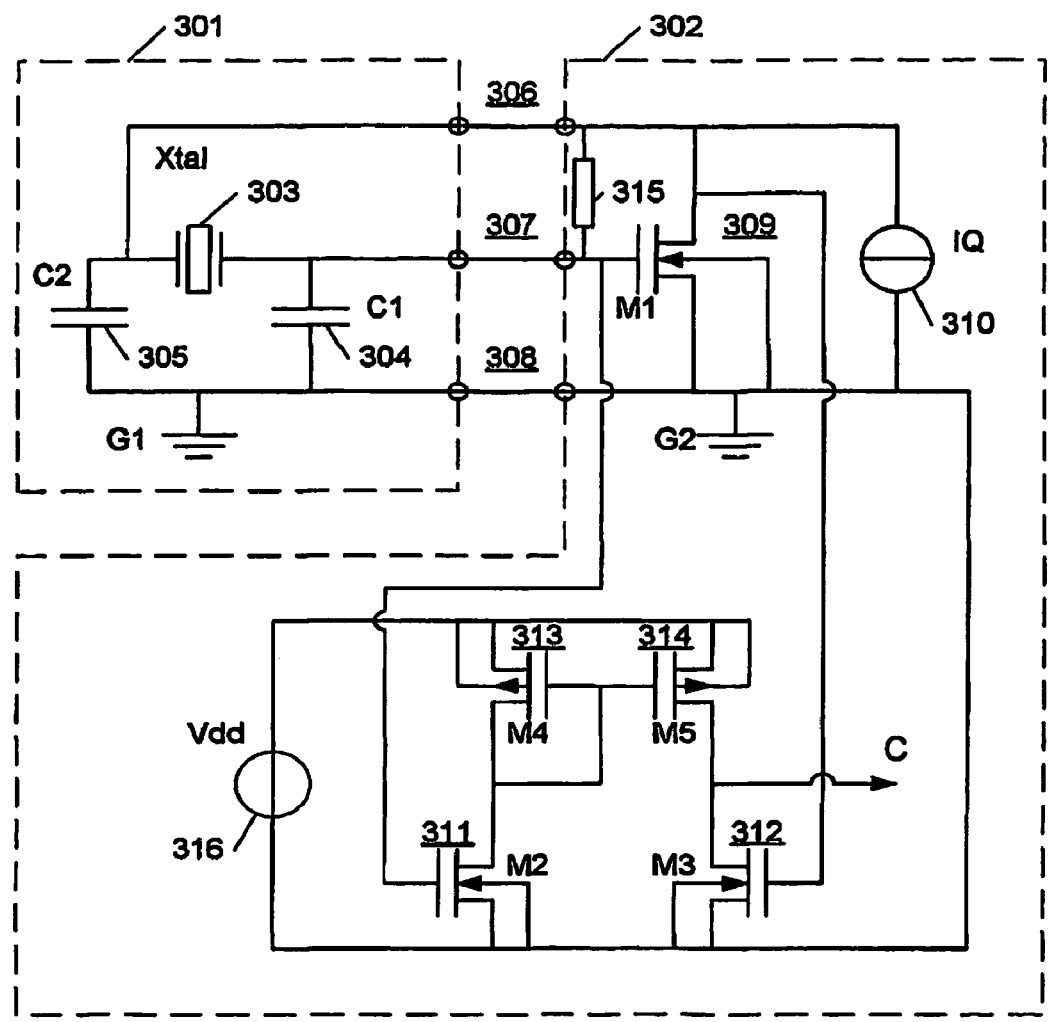
FIG. 3 shows an electrical oscillator circuit coupled to an amplifier with differential inputs and a single-ended output.

FIG. 3 shows an electrical oscillator circuit comprising an amplifier with differential inputs and a single-ended output. As above, the oscillator circuit is illustrated to comprise a first and a second subcircuit.

The first subcircuit 301 comprises an oscillating device in the form of a crystal (Xtal) 303 electrically connected to the second subcircuit 102 by means of two connectors 306 and 307. To diminish high frequency noise the crystal is coupled to the ground reference G1 by means of two capacitors C1 304 and C2 305.

The second subcircuit 302 comprises an active device 309 in the form of a CMOS transistor biased by a current source (IQ) 110. The CMOS transistor and the current source are connected to a ground reference G2. The signal ground reference G2 is electrically connected to the ground reference G1 by means of a conductor 108. A bias resistor 309 is applied between the drain and gate terminal of transistor 309 to provide proper working conditions for the transistor.

Furthermore, and according to the invention, the oscillating signal provided by the crystal 303 which is energized by the active device Ml is connected to the differential inputs of the amplifier. The amplifier is connected to the gate and drain terminal of the active device M1 to receive a differential signal at the gate terminals of CMOS transistors M2 311 and M3 312, respectively. The CMOS transistors M2 and M3 are connected to transistors M4 313 and M5 314 forming a current-mirror. The output of the amplifier is provided at point C as the junction between the drain terminals of M5 and M3. The amplifier is powered by a voltage supply Vdd 316 with reference to the ground reference G2 in the second subcircuit 302.

Thus an oscillating signal with reference to the ground reference G2 at point C in the second circuit can be detected and used by other subcircuits connected to the ground reference G2.

Thereby, the oscillating signal can be detected as a single-mode signal with a low noise level since common mode noise signals induced on the connectors 306 and 307 are suppressed effectively. This result releases the designer of the oscillator from the important design criterion of ensuring low noise induction on the oscillator-to-active-device connection. Now it only has to be ensured that the two-wire-connection between the active device and crystal will be exposed to similar noise signals. This is typically ensured when the wires of the two-wire-connection follow almost the same path on a PCB and/or inside an integrated circuit.

Generally, the term 'signal ground' shall be interpreted broadly to cover any DC stable potential/terminal e.g. a ground potential/terminal or a voltage supply potential/terminal.

Figure 4:
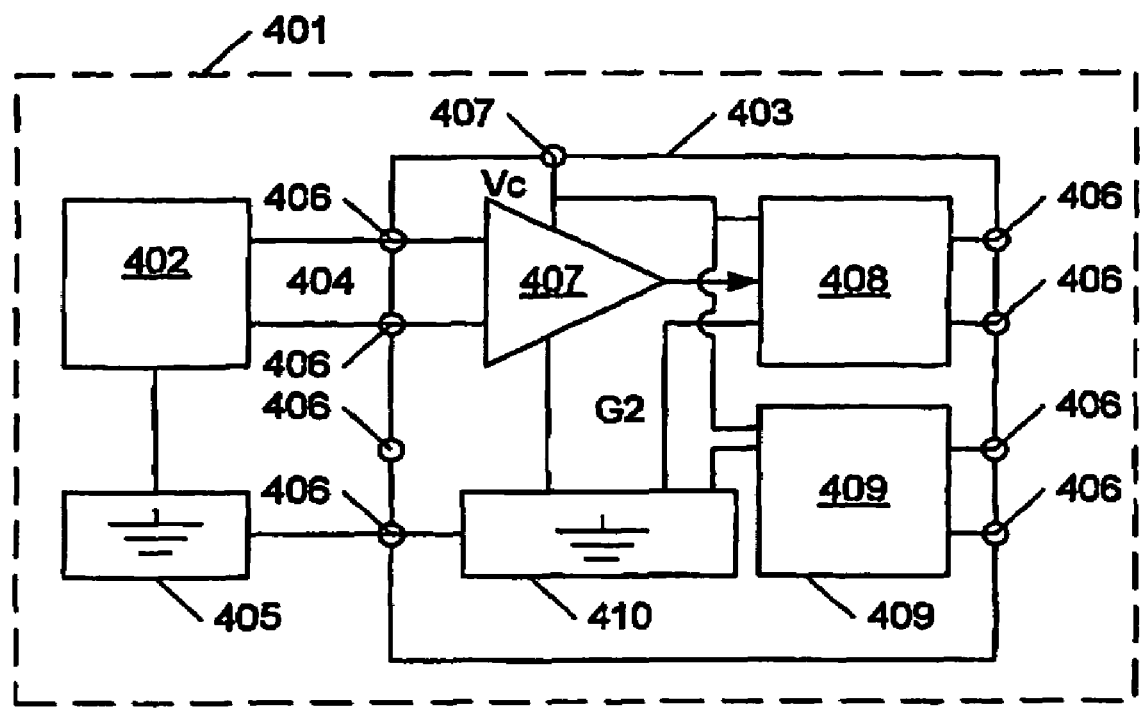
FIG. 4 shows a block diagram of an apparatus utilizing the invention.

FIG. 4 shows a block diagram of an apparatus utilizing the invention. The block diagram depicts a circuit 401 with a resonator unit 402 and an integrated circuit 403.

The resonator 402 is connected to the integrated circuit 403 by means of a two-wire connection 404. Further, the resonator is coupled to a ground reference 405. In a preferred embodiment, the resonator is a crystal coupled to the ground reference 405 by means of capacitors.

However, other types of resonators may be preferred, e.g., in the form of an LC-circuit. An LC-circuit may be preferred when a less accurate, but less expensive resonator is desired. Additionally or alternatively—an LC oscillator may be used if a high frequency resonator is desired.

The integrated circuit 403 comprises an amplifier subcircuit 407 arranged to convert a differential input signal to a single-mode output signal. The output signal is delivered to a subcircuit 408. Further, the integrated circuit 403 comprises an additional subcircuit 409. The subcircuits 408, 409 and the amplifier 407 are connected to a common ground reference 410. The ground references 405, 410 are connected to each other via a single terminal 406. The amplifier subcircuit 407 and the subcircuits 408 and 409 are connected to a voltage supply terminal Vc for supplying voltage power to the subcircuits. This voltage is more generally denoted a power supply reference Vc.

It would be possible to reduce the noise interference by providing additional terminals 406 connected to interconnect the ground references 405, 410 and thereby maintain more stable ground reference voltage potentials. However, this would be infeasible because it will often be necessary to use the limited number of terminals of an integrated circuit for other circuit connections.

Generally, ground references with a low ohmic resistance are preferred since the signal level of the induced noise will be lower, other things being equal. Typically, ground references in printed circuit boards (PCBs) are implemented as a conductive layer in the PCB, thus making it possible to obtain a ground reference with a relatively low ohmic resistance. However, within integrated circuit designs thin electrical connections are used. Consequently, the ohmic resistance of the connector increases and thus involves the problem that the noise level will increase. Therefore especially within integrated circuits it is necessary to workaround the problem of having a ground reference that is more sensitive to electromagnetic noise influx. However, the invention may be utilized for circuit embodiments other than integrated circuits.

In a preferred embodiment the oscillator according to the invention is used in a mobile communications device e.g. a mobile telephone. In such an appliance the oscillator may run constantly in order to maintain a correct timing for the device to stay synchronized with a base-station. Therefore the oscillator is not switched into a sleep-mode like several other components in a mobile communications device. Sometimes, e.g. during exchange of battery supply packs of the device, the device is powered by a capacitor. This fact, in particular creates a demand for an oscillator with very low power consumption.

In the above, the term 'active device' is used as a generic term for transistors or transistor circuits of any type capable of amplifying an electrical signal. The transistors can be Bipolar transistors, CMOS transistors, FET transistors, JFET transistors etc. Moreover, substrates similar to PCB's can be used e.g. ceramic substrates. It should be noted that alternative types of differential-to-single-ended amplifiers can be used according to the invention, e.g. an amplifier as disclosed in U.S. Pat. No. 5,517,148.

I claim:

1. An electrical oscillator circuit comprising:
    a first subcircuit with a first signal ground reference and a second subcircuit with a second signal ground reference and a power supply reference,
    the first signal ground reference being electrically coupled to the second signal ground reference;
    a crystal oscillator comprised in the first subcircuit, wherein the crystal oscillator is coupled to the first ground reference via at least one capacitor having a relatively low impedance at frequencies above the oscillating frequency and a relatively high impedance at the oscillating frequency;
    an active device comprised in the second subcircuit coupled to energize the crystal oscillator to provide an oscillating electrical signal transmitted as a differential signal via a two wire conductor to the second subcircuit;
    wherein the second subcircuit further comprises
    means for receiving the differential signal transmitted via the two wire conductor; and
    converting, via a differential amplifier, the differential signal to a single-ended signal with reference to the second signal ground reference or the power supply reference of the second subcircuit.

2. An electrical oscillator circuit according to claim 1, wherein the first subcircuit is arranged on a printed circuit board.

3. An electrical oscillator circuit according to claim 1, wherein the second subcircuit is arranged in an integrated circuit component, I.C.

4. An electrical oscillator circuit according to claim 1, wherein the active device is a CMOS type transistor.

5. An electrical oscillator circuit according to claim 4, wherein the CMOS type transistor is coupled with its source terminal to the second signal ground reference of the second subcircuit, with its drain terminal coupled to a current or voltage supply and to one of the electrical conductors, and with its gate connected to the other of the electrical conductors.

6. An electrical oscillator circuit according to claim 1, wherein the means for receiving the differential signal transmitted via the electrical conductors is a differential amplifier.

7. An electrical oscillator circuit according to claim 1, wherein the means for receiving the differential signal transmitted via the electrical conductors is connected to supply the single-ended signal to components comprised in the second subcircuit.

8. An integrated circuit with a signal ground reference, comprising:
   terminals for connecting a crystal oscillator to the integrated circuit wherein the crystal oscillator is coupled to the signal ground reference via at least one capacitor having a relatively low impedance at frequencies above the oscillating frequency and a relatively high impedance at the oscillating frequency;
   an active device connectable via the terminals of the crystal oscillator to energize the crystal oscillator to provide an oscillating electrical signal transmitted as a differential signal via two electrical conductors to the active device; and
   means for receiving the differential signal transmitted via the two electrical conductors and converting the differential signal to a single-ended signal with reference to the signal ground reference of the integrated circuit.

9. An integrated circuit according to claim 8, wherein the means for receiving the differential signal is a differential amplifier.

10. An integrated circuit according to claim 8 wherein the means are connected to supply the single-ended signal to the second subcircuit.

11. An integrated circuit according to claim 8, wherein the active device is a CMOS type transistor.

12. An integrated circuit according to claim 11, wherein the CMOS type transistor is coupled with its source terminal to the signal ground reference of the second subcircuit, with its drain terminal coupled to a current or voltage supply and to one of the electrical conductors, and with its gate connected to the other of the electrical conductors.

* * * * *